United States Patent
Kim

(10) Patent No.: US 7,250,811 B2
(45) Date of Patent: Jul. 31, 2007

(54) INTERNAL VOLTAGE GENERATOR OF SEMICONDUCTOR MEMORY DEVICE

(75) Inventor: Kyung-Whan Kim, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 129 days.

(21) Appl. No.: 11/026,994

(22) Filed: Dec. 30, 2004

(65) Prior Publication Data

US 2006/0091938 A1 May 4, 2006

(30) Foreign Application Priority Data

Oct. 29, 2004 (KR) .................. 10-2004-0087320

(51) Int. Cl.
*G05F 1/10* (2006.01)

(52) U.S. Cl. ..................... 327/538; 327/543

(58) Field of Classification Search ............... 327/538, 327/540–541, 543–546
See application file for complete search history.

(56) References Cited

U.S. PATENT DOCUMENTS

| | | | |
|---|---|---|---|
| 5,821,808 A * | 10/1998 | Fujima | 327/541 |
| 6,218,893 B1 | 4/2001 | Noguchi | |
| 6,249,174 B1 | 6/2001 | Tsunezawa | |
| 6,404,252 B1 * | 6/2002 | Wilsch | 327/198 |
| 6,753,720 B2 * | 6/2004 | Kono et al. | 327/538 |
| 6,785,183 B2 | 8/2004 | Sivero et al. | |
| 6,842,382 B2 | 1/2005 | Kim et al. | |
| 6,861,872 B2 | 3/2005 | Suh | |
| 6,868,026 B2 | 3/2005 | Fujioka | |
| 6,963,230 B2 * | 11/2005 | Morishita | 327/77 |
| 2002/0036942 A1 | 3/2002 | Ooishi | |

FOREIGN PATENT DOCUMENTS

| | | |
|---|---|---|
| JP | 11-175175 | 7/1998 |
| JP | 2002-197851 | 7/2002 |
| JP | 2003-085977 | 3/2003 |

* cited by examiner

*Primary Examiner*—Cassandra Cox
(74) *Attorney, Agent, or Firm*—Blakely Sokoloff Taylor & Zafman

(57) ABSTRACT

The present invention provides an internal voltage generator for maintaining a voltage level of an internal voltage by forcibly discharging an over-supplied voltage. The internal voltage generator includes a reference voltage generator for outputting at least one reference voltage with a predetermined voltage level after receiving an external voltage; a level shifter for outputting an internal reference voltage with a shifted voltage level by receiving the reference voltage of the reference voltage generator; a driver for outputting an internal voltage by using the internal reference voltage; and a discharging unit for forcibly discharging an over-supplied voltage of the internal voltage by a release pulse signal.

24 Claims, 9 Drawing Sheets

INTERNAL VOLTAGE GENERATOR OF SEMICONDUCTOR MEMORY DEVICE

FIELD OF INVENTION

The present invention relates to a semiconductor memory device; and, more particularly, to an internal voltage generator for converting an external voltage to an internal voltage.

DESCRIPTION OF PRIOR ART

In general, since an internal voltage generator has an advantageous merit that power is stably supplied and current consumption is reduced, it has been widely used for a very large scale integrated (VLSI) chip as well as a semiconductor memory chip. However, according to the conventional internal voltage generator, there is a problem that it is difficult to adjust a voltage level of an internal voltage.

FIG. 1A is a block diagram setting forth the conventional internal voltage generator of the semiconductor memory device and FIG. 1B is a graph showing various voltage levels versus an external voltage in the conventional internal voltage generator.

Referring to FIG. 1A, the conventional internal voltage generator includes a reference voltage generator 110, a level shifter 120, an analog driver 130, a complementary metal oxide semiconductor (CMOS) driver 140 and a standby driver 150. Herein, the reference voltage generator generates a reference voltage VREF_BASE with a predetermined voltage level. The level shifter 120 receives the reference voltage VREF_BASE and outputs an internal reference voltage VREF_INT with a shifted voltage level. The analog driver 130 supplies an internal voltage VINT to an analog circuit by using the internal reference voltage VREF_INT. The standby driver 150 supplies a standby internal voltage using the internal reference voltage VREF_INT.

In detail, the reference voltage generator 110 generates the reference voltage VREF_BASE when the voltage level of the external voltage rises up to reach a desired voltage level, which is shown in FIG. 1B. Typically, a bandgap reference voltage generator and a Widlar reference voltage generator is popularly used as the reference voltage generator 110.

The level shifter 120 maintains that the reference voltage VREF_BASE inputted to a differential comparator has a same with a resistor voltage VR. Here, the voltage level of the internal reference voltage VREF_INT outputted from the level shifter 120 is mainly determined by a resistance ratio between a first resistor R1 and a second resistor R2. That is, a current (I) flowing through the second resistor R2 is calculated from a following equation 1. In addition, the internal reference voltage VREF_INT can be calculated from a following equation 2.

$$I = VR/R2 \quad \text{[Eq. 1]}$$

$$VREF\_INT = VR(1 + R1/R2) \quad \text{[Eq. 2]}$$

Herein, a denotation of VBIAS in FIG. 1A refers to a bias voltage that is applied to operate the differential comparator in the level shifter 120.

At an output end of the level shifter 120, a plurality of drivers 130, 140 and 150 are connected in parallel. Therefore, in case that the voltage level of the internal voltage VINT is decreased below the voltage level of the internal reference voltage VREF_INT after comparing the internal voltage VINT with the internal reference voltage VREF_INT, a PMOS transistor is turned on so that the voltage level of the internal voltage VINT rises up.

On the contrary, provided that the voltage level of the internal voltage VINT rises up above the voltage level of the internal reference voltage VREF_INT, the PMOS transistor is turned off so that the voltage level of the internal voltage VINT does not rise anymore.

Meanwhile, the analog driver 130 and the CMOS driver 140 is an active driver with a large capacity for supplying a lot of current in an active state. The standby driver 150 is a drive with a small capacity for outputting the standby internal voltage regardless of an operation state.

At an initial operation state that a power voltage is applied to the memory device, the standby driver 150 is only operated. On the other hand, the active driver is activated by means of an active enable pulse signal ACT_EN, wherein the active enable pulse signal ACT_EN is in logic high level when the memory device enters the active mode. In more detail, the active enable pulse signal ACT_EN is maintained logic high level during a predetermined period from an active signal ACT to a precharge signal in consideration of a timing margin.

The reason that the active driver is only operated when the active enable pulse signal ACT_EN is in logic high level is to cut off a standby current flowing through the active driver.

Meanwhile, if the voltage level of the internal voltage VINT is lower than that of the internal reference voltage VREF_INT, the PMOS transistor of the CMOS driver 140 is completely turned on, which is different from the analog driver 130. That is, an external voltage level VDD or a ground voltage level GND is applied to the gate of the PMOS transistor in the CMOS driver 140. The CMOS driver 140 is widely used for the internal voltage generator because the CMOS driver 140 can maximize a driving force of a voltage driving circuit using a small PMOS transistor. In addition, there are several differences between the active driver and the standby driver, e.g., a size of the PMOS transistor, a response speed and so forth. Generally, the standby driver employs a discharge transistor for discharging a current of a few µA so as to maintain that the driving circuit is reliably operated with the stable voltage level of the internal voltage VINT.

FIG. 2 is a waveform diagram setting forth a waveform of the internal voltage VINT in the conventional internal voltage generator.

To begin with, when the semiconductor memory device is in active state, the active enable pulse signal ACT_EN becomes in logic high level so as to activate the active driver 130 and 140. As internal circuits which use the internal voltage VINT are operated, the voltage level of the internal voltage VINT is decreased. But, soon after, as the active driver is operated, the voltage level of the internal voltage VINT rises up. At this time, in case that the voltage level of the internal voltage VINT rises up above that of the internal reference voltage VREF_INT, the comparator of the active driver outputs a signal of logic high level to turn off the PMOS transistor and thus the voltage level of the internal voltage VINT does not rise up anymore.

Meanwhile, it takes a predetermined time for the comparator to output the comparison result when the voltage level of the internal voltage VINT becomes above that of the internal reference voltage VREF_INT. Thus, the voltage level of the internal voltage VINT is inevitably higher than that of the internal reference voltage VREF_INT for the time being, which is shown as X in FIG. 2. This is so called an over-supplied voltage X.

However, since the size of the PMOS transistor is determined to meet maximum consumption of the internal voltage VINT, the over-supplied voltage X is increased much more in case of using small internal voltage VINT owing to an excessive large PMOS transistor. The over-supplied voltage X is mainly discharged through the discharge transistor in the standby driver 150. However, a portion of the over-supplied voltage X becomes a leakage component so as to reduce the voltage level of the internal voltage VINT gradually, As described above, the conventional internal voltage generator has a disadvantage that the over-supplied voltage X is very large if there is a large difference of using the internal voltage or the response speed of the active driver is slow. As a result, it takes a long time for discharging the voltage level of the internal voltage VINT by only using the discharge transistor in the standby driver.

SUMMARY OF INVENTION

It is, therefore, an object of the present invention to provide an internal voltage generator of a semiconductor memory device for maintaining a voltage level of an internal voltage by forcibly discharging an over-supplied voltage.

It is, therefore, another object of the present invention to provide a method for controlling the internal voltage generator in order to maintain a voltage level of an internal voltage by forcibly discharging an over-supplied voltage.

In accordance with an aspect of the present invention, there is provided an internal voltage generator including: a reference voltage generation means for outputting at least one reference voltage with a predetermined voltage level after receiving an external voltage; a level shifting means for outputting an internal reference voltage with a shifted voltage level by receiving the reference voltage of the reference voltage generation means; a driving means for outputting an internal voltage by using the internal reference voltage; and a discharging means for forcibly discharging an over-supplied voltage of the internal voltage by a release pulse signal.

In accordance with another aspect of the present invention, there is provided a method for controlling an internal voltage generator, including the steps of: a) outputting a reference voltage with a predetermined voltage level by receiving an external voltage; b) outputting an internal reference voltage with a shifted voltage level by receiving the reference voltage; c) outputting an internal voltage in an active mode by using the internal reference voltage; d) outputting an standby internal voltage regardless of an operation state by using the internal reference voltage; and e) forcibly discharging the internal voltage by using a release pulse signal outputted from a release pulse signal generator, wherein the release pulse signal is outputted when an active enable pulse signal is deactivated.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, an internal voltage generator of a semiconductor memory device in accordance with preferred embodiments of the present invention will be described in detail referring to the accompanying drawings.

Figure 1A:
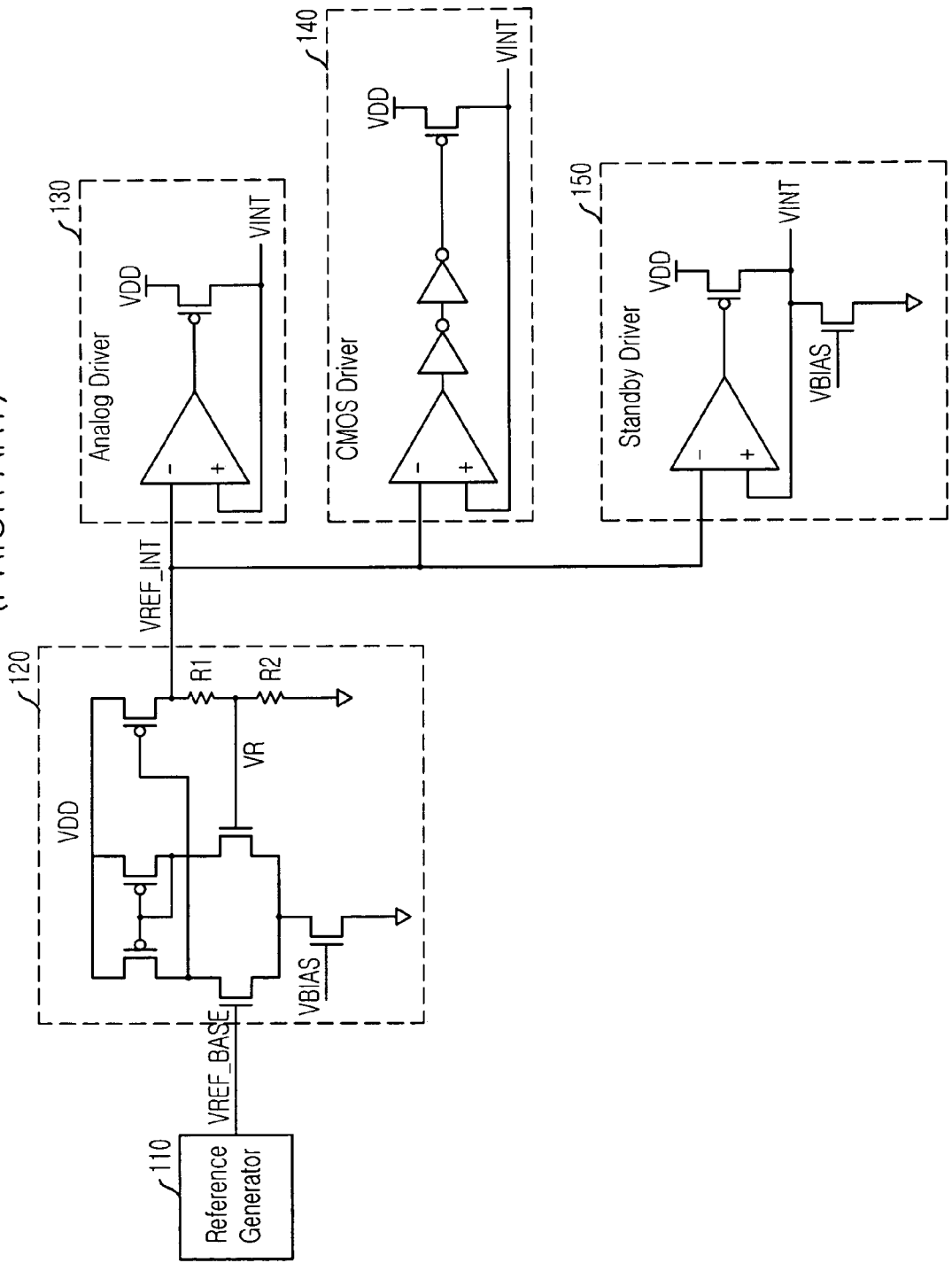
FIG. 1A is a block diagram setting forth a conventional internal voltage generator of a semiconductor memory device.
Figure 1B:
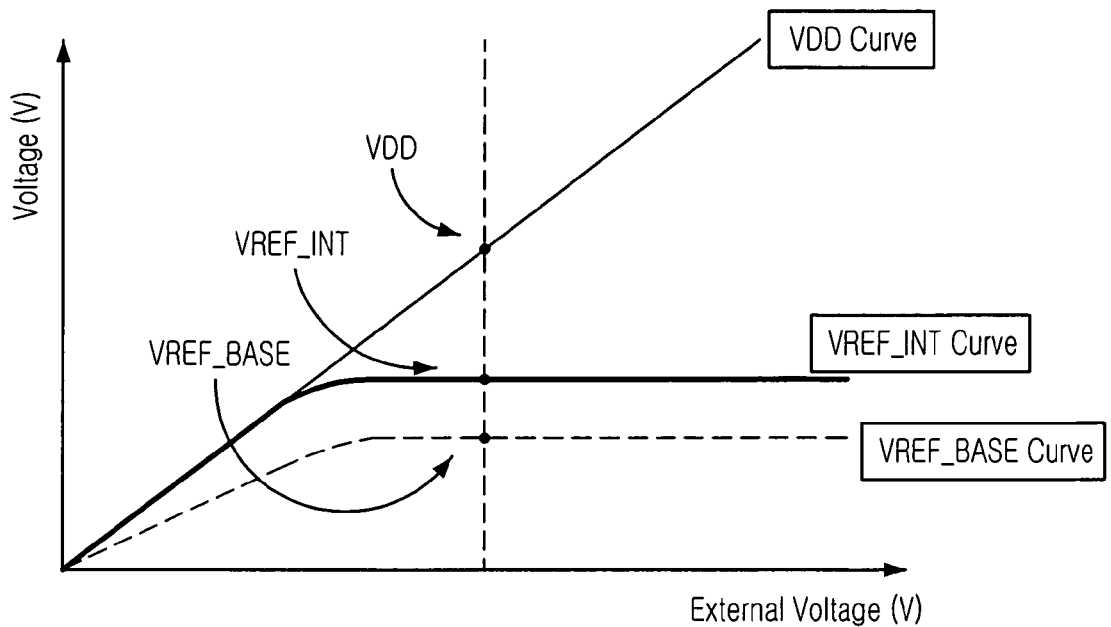
FIG. 1B is a graph showing respective voltage variance versus the external voltage according to the conventional internal voltage generator.
Figure 2:
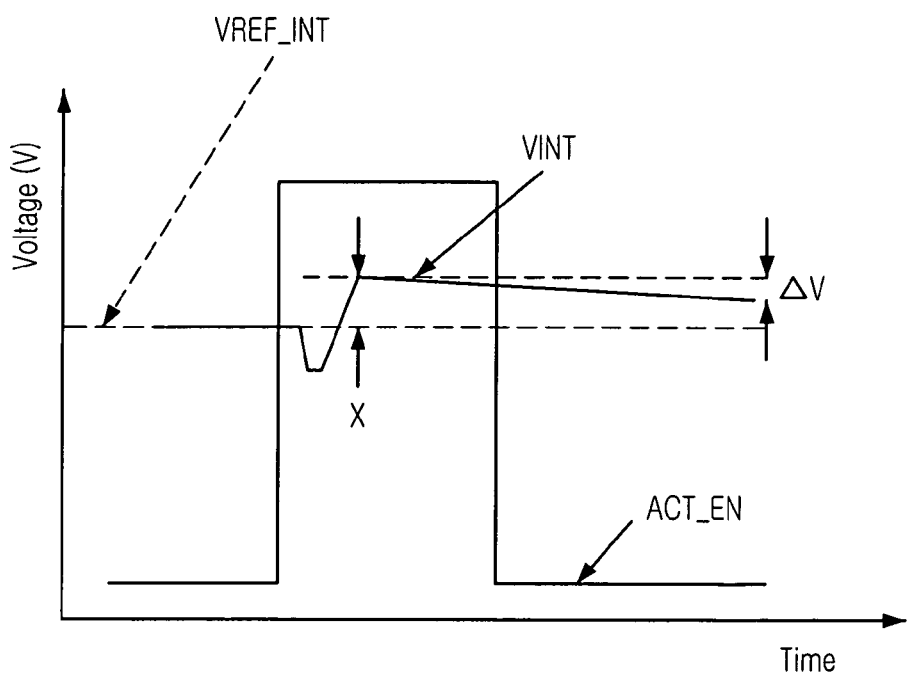
FIG. 2 is a waveform diagram depicting a waveform of an internal voltage in the conventional internal voltage generator.
Figure 3:
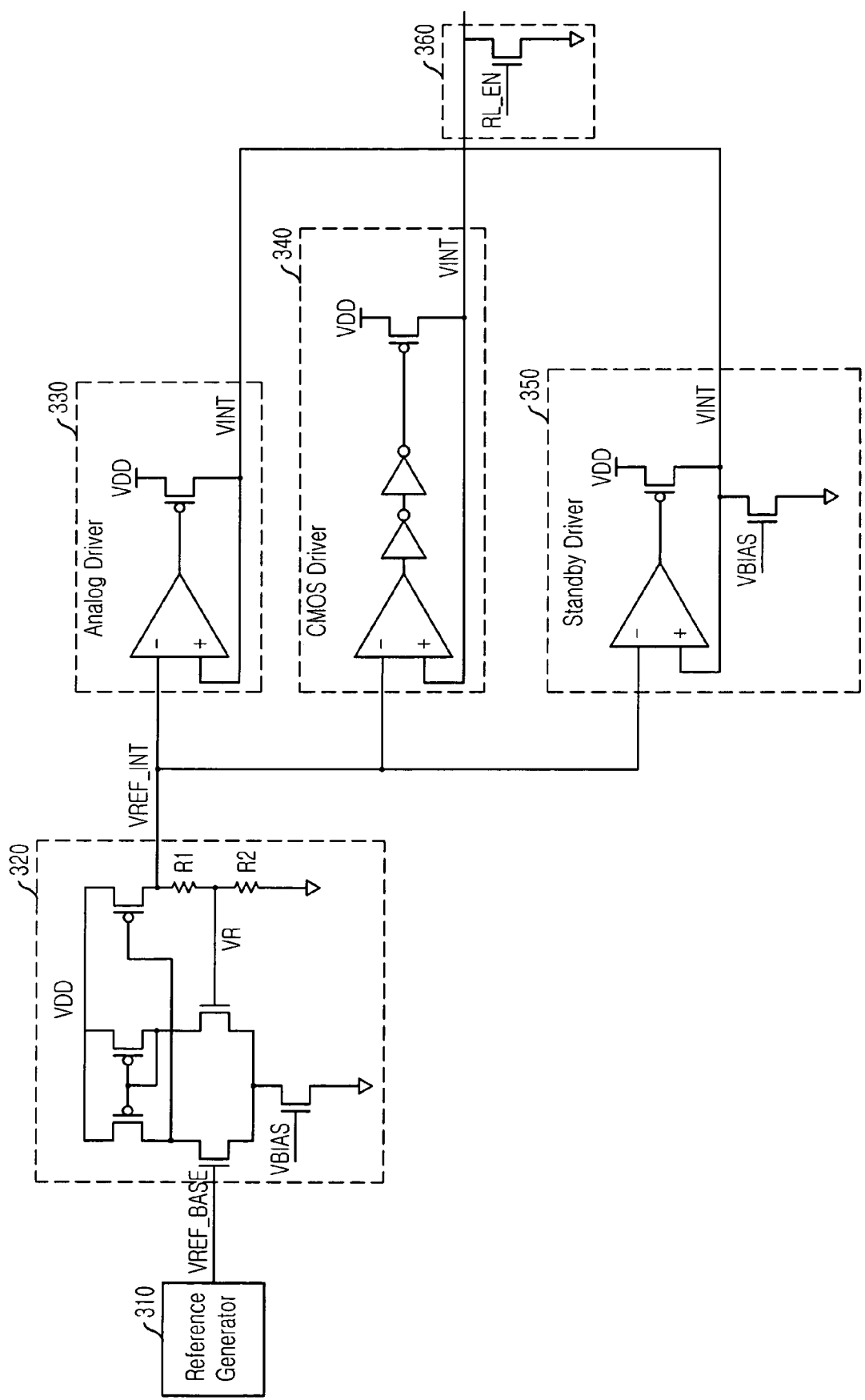
FIG. 3 is a block diagram setting forth an internal voltage generator of a semiconductor memory device in accordance with a first preferred embodiment of the present invention.

FIG. 3 is a block diagram setting forth an internal voltage generator of a semiconductor memory device in accordance with a first preferred embodiment of the present invention.

Referring to FIG. 3, the inventive internal voltage generator includes a reference voltage generator 310, a level shifter 320, an analog driver 330, a complementary metal oxide semiconductor (CMOS) driver 340, a standby driver 350 and a discharging unit 360.

Herein, the reference voltage generator 310 outputs a reference voltage VREF_BASE with a predetermined voltage level; The level shifter 320 receives the reference voltage VREF_INT of the reference voltage generator 310 and outputs an internal reference voltage VREF_INT of which voltage level is shifted. The analog driver 330 supplies an internal voltage VINT to an analog circuit by using the internal reference voltage VREF_INT. The CMOS driver 340 supplies the internal voltage VINT to a CMOS circuit by using the internal reference voltage VREF_INT. The standby driver 350 supplies a standby internal voltage VINT by using the internal reference voltage VREF_INT. The discharging unit 360 forcibly discharges the internal voltage VINT outputted from each driver 330, 340 and 350 by using a release pulse signal RL_EN as a control signal. In the first preferred embodiment, the discharging unit 360 is implemented as a discharge transistor, i.e. an NMOS transistor, where the release pulse signal RL_EN is applied to a gate thereof.

Figure 4:
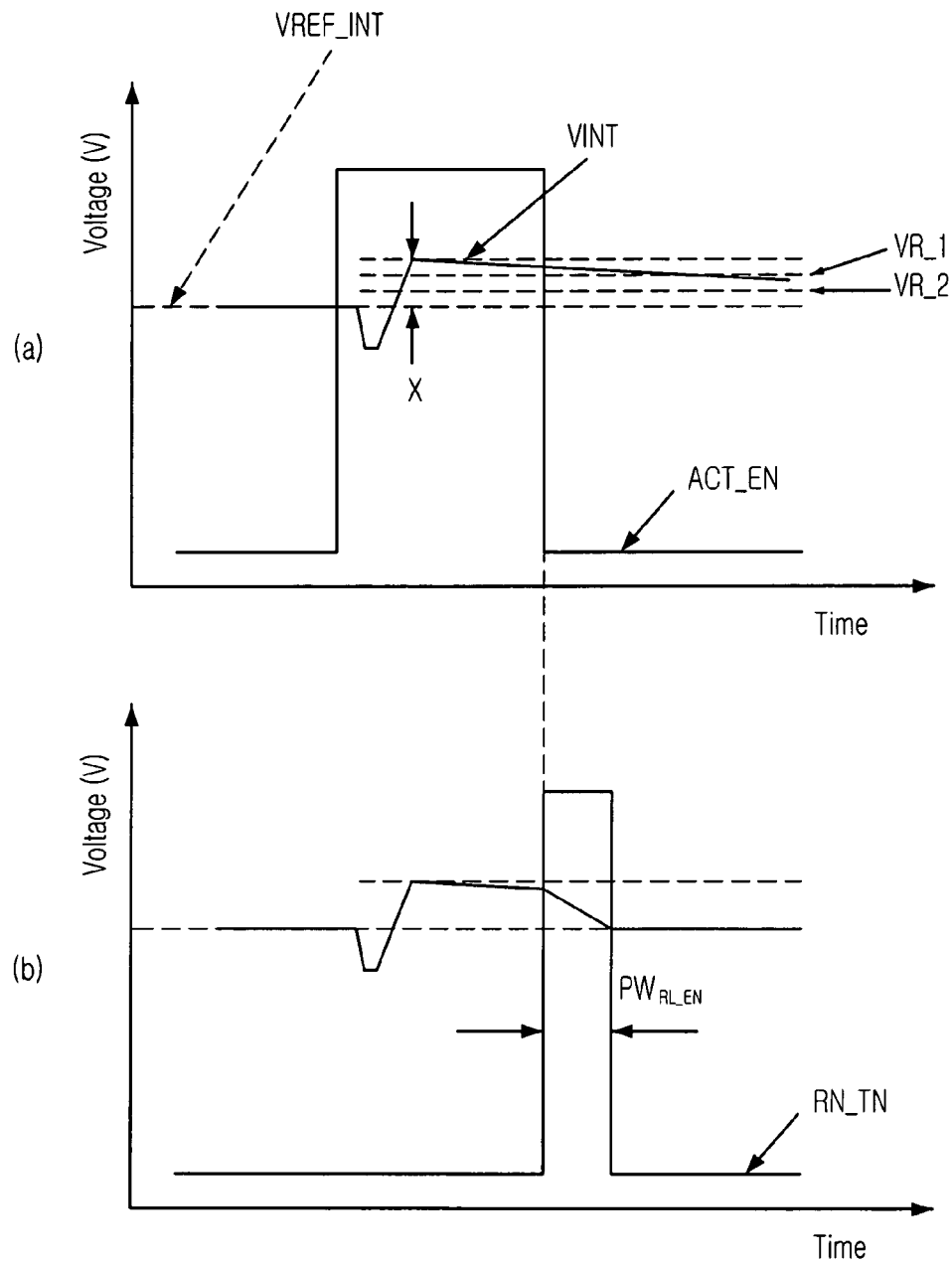
FIG. 4A is a graph showing two reference voltages for determining a magnitude of an over-supplied voltage by comparing the internal voltage with the reference voltages in accordance with the present invention.
FIG. 4B is a waveform diagram setting forth waveforms of the release pulse signal and the internal voltage in accordance with the present invention.

FIG. 4A is a graph showing two reference voltages for determining a magnitude of an over-supplied voltage X by comparing the internal voltage VINT with the reference voltages in accordance with the present invention.

Herein, the internal reference voltage VREF_INT is correspondent to a target voltage level of the internal voltage VINT. A first reference voltage VR_1 and a second reference voltage VR_2 denote voltage levels for sectioning the over-supplied voltage into three portions between the internal voltage VINT and the internal reference voltage VREF_INT. In the first preferred embodiment, though two reference voltages VR_1 and VR_2 are used, the reference voltage is classified into three or more, if necessary. Meanwhile, when the active enable pulse signal ACT_EN becomes in logic low level, a determination operation is performed so as to determine whether or not the internal voltage VINT exceeds to the internal reference voltage VREF_INT.

FIG. 4B is a waveform diagram setting forth waveforms of the release pulse signal RL_EN and the internal voltage VINT in accordance with the present invention.

Referring to FIG. 4B, the release pulse signal RL_EN is generated when the active enable pulse signal ACT_EN becomes in logic low level. Thereafter, the release pulse signal RL_EN is applied to the gate of the discharge transistor in the discharging unit 360 so as to discharge the internal voltage VINT, wherein the size of the discharge transistor in the discharging unit 360 is larger than the discharge transistor in the standby driver 350. Meanwhile, it is preferred that a width $PW_{RL\_EN}$ of the release pulse signal RL_EN is not fixed but is varied according to the magnitude of the over-supplied voltage X. That is, if the over-supplied voltage X is large, it is preferable to increase the width $PW_{RL\_EN}$ of the release pulse signal RL_EN. On the contrary, in case of small over-supplied voltage X, it is more preferable to reduce the width $PW_{RL\_EN}$ of the release pulse signal RL_EN.

Figure 5:
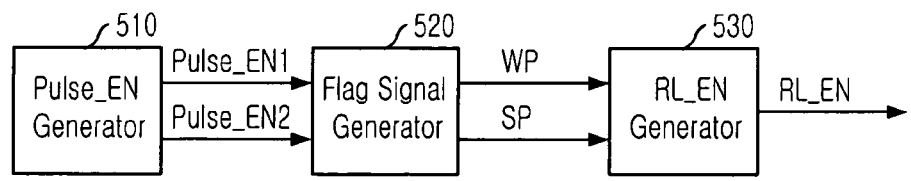
FIG. 5 is a block diagram setting forth a release pulse signal generator for use in the internal voltage supplier in accordance with the present invention.

FIG. 5 is a block diagram setting forth a release pulse signal generator for use in the internal voltage supplier in accordance with the present invention.

Referring to FIG. 5, the release pulse signal generator includes a pulse enable signal generation unit 510, a flag signal generation unit and a release pulse signal generation unit 530. Herein, the pulse enable signal generation unit 510 generates a first and a second pulse enable signals Pulse_EN1 and Pulse_EN2 by using the first and the second reference voltages VR_1 and VR_2. The flag signal generation unit 520 generates a wide pulse signal WP and a short pulse signal SP by using the first and the second pulse enable signals Pulse_EN1 and Pulse_EN2, wherein the wide pulse signal WP has a wide pulse width and the short pulse signal SP has a short pulse width. The release pulse signal generation unit 530 generates the release pulse signal RL_EN by using the predetermined pulse signal with the wide pulse signal WP and the short pulse signal SP.

Figure 6:
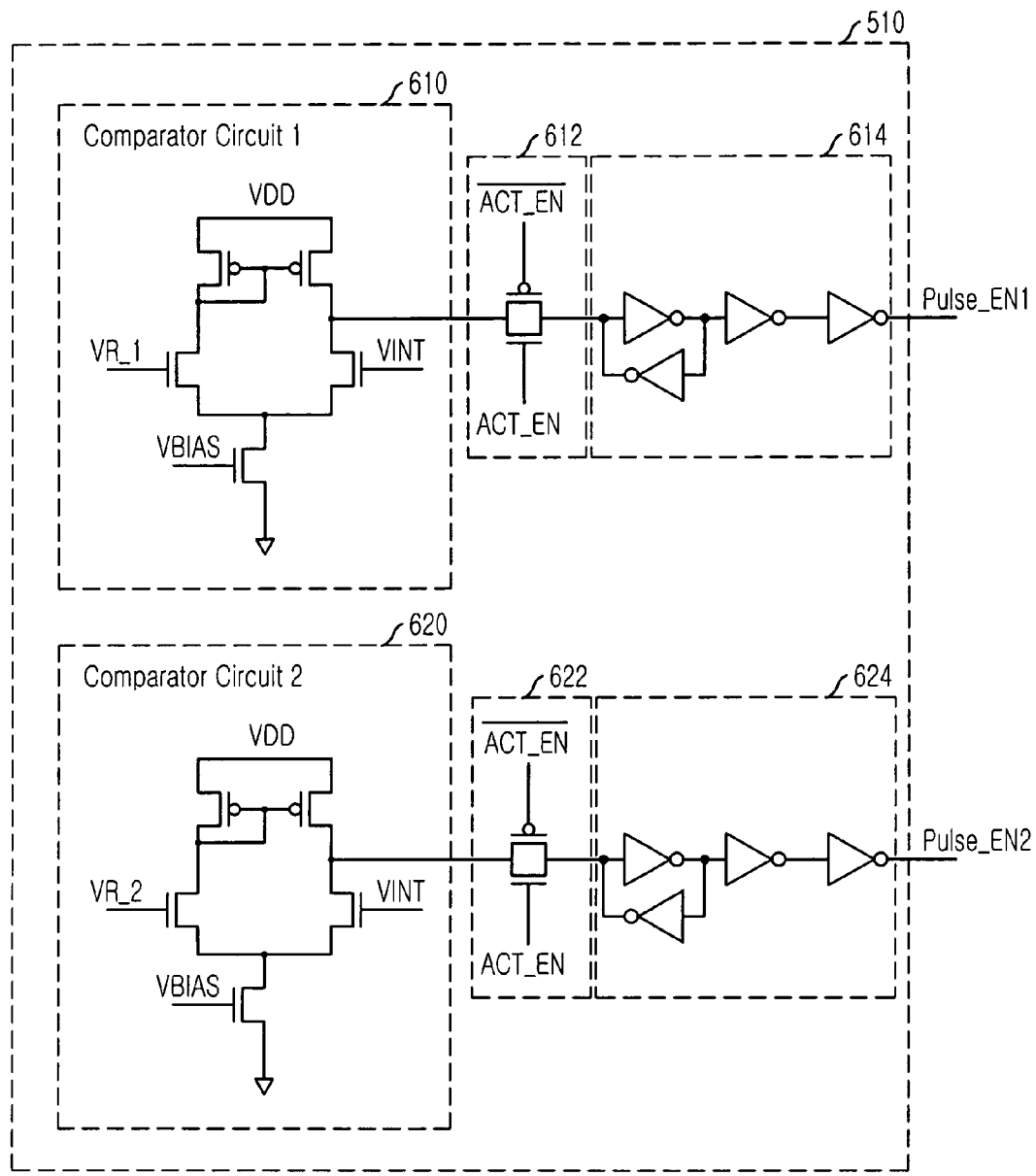
FIG. 6 is the pulse enable signal generation unit of the release pulse signal generator which is shown in FIG. 5 in accordance with the present invention.

FIG. 6 is the pulse enable signal generation unit 510 of the release pulse signal generator which is shown in FIG. 5 in accordance with the present invention.

Referring to FIG. 6, the pulse enable signal generation unit is provided with a first comparator 610, a first transfer gate 612, a first latching/delaying unit 614, a second comparator 620, a second transfer gate 622 and a second latching/delaying unit 624. Herein, the first comparator 610 compares the internal voltage VINT with the first reference voltage VR_1 and the second comparator 620 compares the internal voltage VINT with the second reference voltage VR_2. In addition, the first transfer gate 612 transfers the output of the first comparator 610 to the first latching/delaying unit 614 when the active enable pulse signal ACT_EN is activated. Likewise, the second transfer gate 612 transfers the output of the second comparator 620 to the second latching/delaying unit 624 when the active enable pulse signal ACT_EN is activated. The first and the second latching/delaying units 614 and 624 latch and delay the outputs of the first and the second transfer gates 612 and 622, respectively.

In more detail, the pulse enable signal generation unit 510 determines a state of the first pulse enable signal Pulse_EN1 or the second pulse enable signal Pulse_EN2 by comparing the internal voltage VINT with the first reference voltage VR_1 or the second reference voltage VR_2. Herein, provided that the voltage level of the internal voltage VINT is higher than the first reference voltage VR_1, the first pulse enable signal Pulse_EN1 becomes in logic high level. Since the second reference voltage VR_2 is lower than the first reference voltage VR_1, the second pulse enable signal Pulse_EN2 becomes in logic high level also.

Meanwhile, it is preferable that the first and the second comparators 610 and 620 operate within a period that the active enable pulse signal ACT_EN is in logic high level to minimize power consumption.

The transfer gates 612 and 622 are controlled by the active enable pulse signal ACT_EN and are turned off when the active enable pulse signal ACT_EN is in logic low level. The latching/delaying units 614 and 624 are disposed in rear of the transfer gates 612 and 622 and play such a role that the comparison result of the first and the second comparators 610 and 620 do not influence on the first and the second pulse enable signals Pulse_EN1 and Pulse_EN2.

As described above, the number of the reference voltage for comparison may be changed according to various conditions. Thus, in this case, the same number of the comparator corresponding to the number of the reference voltage is required in the internal voltage generator. This modification is obvious for those skilled in the art so that further detail description will be omitted herein.

Figure 7:
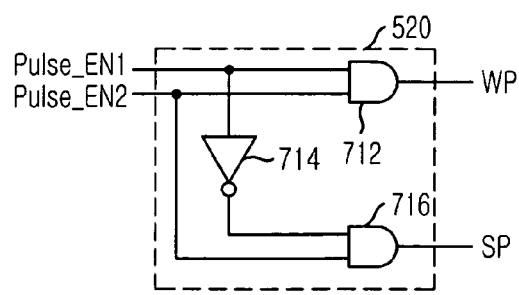
FIG. 7 is a circuit diagram setting forth the flag signal generation unit of the release pulse signal generator which is shown in FIG. 5 in accordance with the present invention.

FIG. 7 is a circuit diagram setting forth the flag signal generation unit 520 of the release pulse signal generator which is shown in FIG. 5 in accordance with the present invention.

Referring to FIG. 7, the flag signal generation unit 520 is provided with a first AND gate 712, an inverter 714 and a second AND gate 716. The first AND gate 712 performs a logic AND operation to the first pulse enable signal Pulse_EN1 and the second pulse enable signal Pulse_EN2 so as to output the wide pulse signal WP. The second AND gate 716 performs a logic AND operation to the first pulse enable signal Pulse_EN1 inverted at the inverter 714 and the second pulse enable signal Pulse_EN2 to output the short pulse signal SP.

In detail, the flag signal generation unit 520 generates the wide pulse signal WP and the short pulse signal SP by using the first and the second pulse enable signals Pulse_EN1 and Pulse_EN2. That is, when the voltage level of the internal voltage VINT is higher than the first reference voltage VR_1, the flag signal generation unit 520 generates the wide pulse signal WP. Furthermore, the flag signal generation unit 520 generates the short pulse signal SP if the voltage level of the internal voltage VINT is between the first reference voltage VR_1 and the second reference voltage VR_2. In addition, provided that the voltage level of the internal voltage VINT is lower than the second reference voltage VR_2, the over-supplied voltage X of the internal voltage VINT is small so that it is unnecessary to discharge the internal voltage VINT. Therefore, the wide pulse signal WP and the short pulse signal SP become in logic low level in this case.

Table 1 shows various flag signals which are generated according to the pulse enable signal by comparing the internal voltage VINT with the reference voltages VR_1 and VR_2.

TABLE 1

| Case | Pulse_EN1 | Pulse_EN2 | Result |
|---|---|---|---|
| VR_1 < VINT | H | H | Wide pulse generation (WP = "H") |
| VR_2 < VINT < VR_1 | L | H | Short pulse generation (SP = "H") |
| VINT < VR_2 | L | L | No pulse generation (WP&SP = "L") |

Figure 8A:
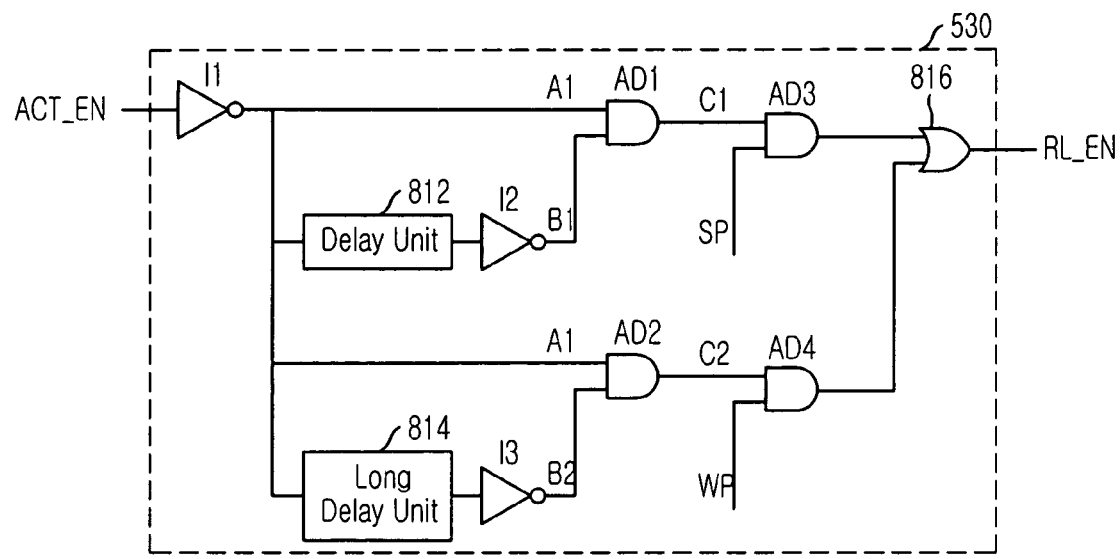
FIG. 8A is a circuit diagram setting forth the release pulse signal generation unit in accordance with the present invention.
Figure 8B:
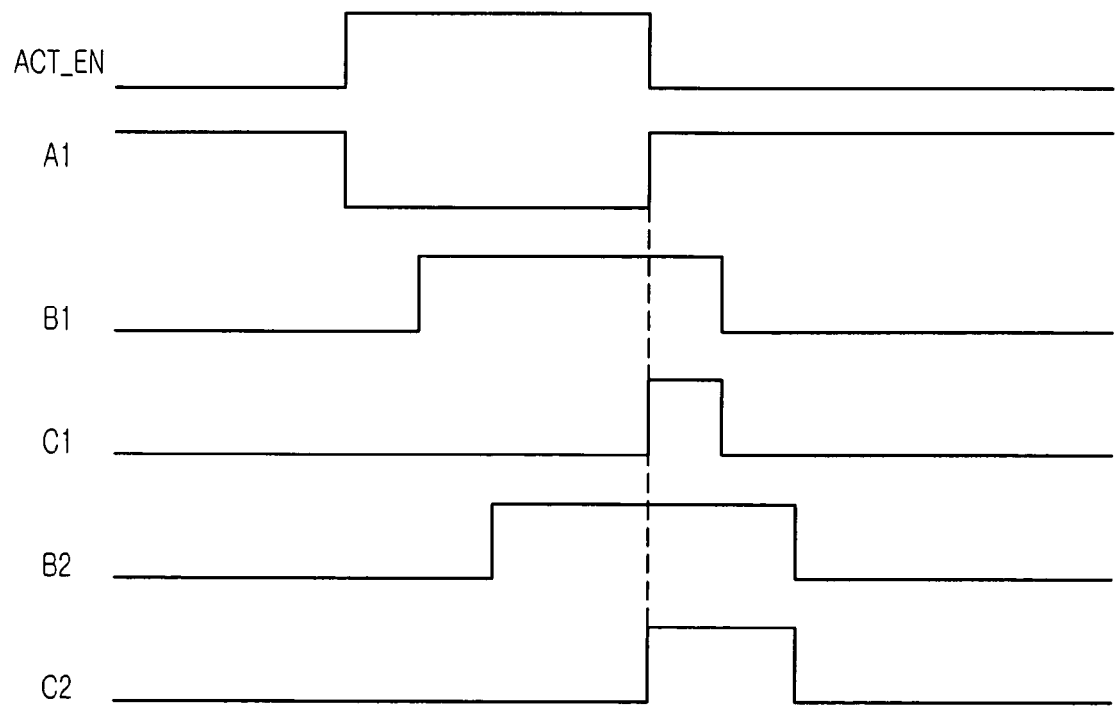
FIG. 8B is a timing diagram of each part of the release pulse signal generation unit in accordance with the present invention.

FIG. 8A is a circuit diagram setting forth the release pulse signal generation unit 530 in accordance with the present invention and FIG. 8B is a timing diagram of each part depicted in FIG. 8A.

Referring to FIG. 8A, the release pulse signal generation unit 530 is provided with a plurality of AND gates AD1 to AD4, a first and a second delay units 812 and 814, a plurality of inverters I1 to I3 and an OR gate 816.

The release pulse signal generation unit 530 utilizes a pulse generator for generating a pulse which is enabled for a predetermined time soon after the active enable pulse signal ACT_EN is disabled. Referring to FIGS. 8A and 8B, to begin with, the active enable pulse signal ACT_EN is inverted at a first inverter I1. In addition, the active enable pulse signal ACT_EN is delayed and inverted through a first delay unit 812 and a second inverter I2. Then, a first AND gate performs a logic AND operation to the inverted active enable pulse signal A1 and the delayed/inverted active enable pulse signal B1 in order to output a first pulse signal C1. Herein, the pulse width of the first pulse signal C1 can be adjusted according as how long the first delay unit 812 delays the active enable pulse signal ACT_EN. Meanwhile, in order to generate a second pulse signal C2 having a wide pulse width than the first pulse signal C1 of the first AND gate AD1, there is employed a long delay unit 814. The OR gate 816 performs a logic OR operation to the output of a third AND gate AD3 and the output of a fourth AND gate AD4 so as to output the release pulse signal RL_EN with desired pulse width.

That is, the release pulse signal RL_EN has a pulse width corresponding to the first pulse signal C1 when the first pulse signal C1 is in logic high level. Likewise, the release pulse signal RL_EN has a pulse width corresponding to the second pulse signal C2 when the second pulse signal C2 is in logic high level.

Figure 9:
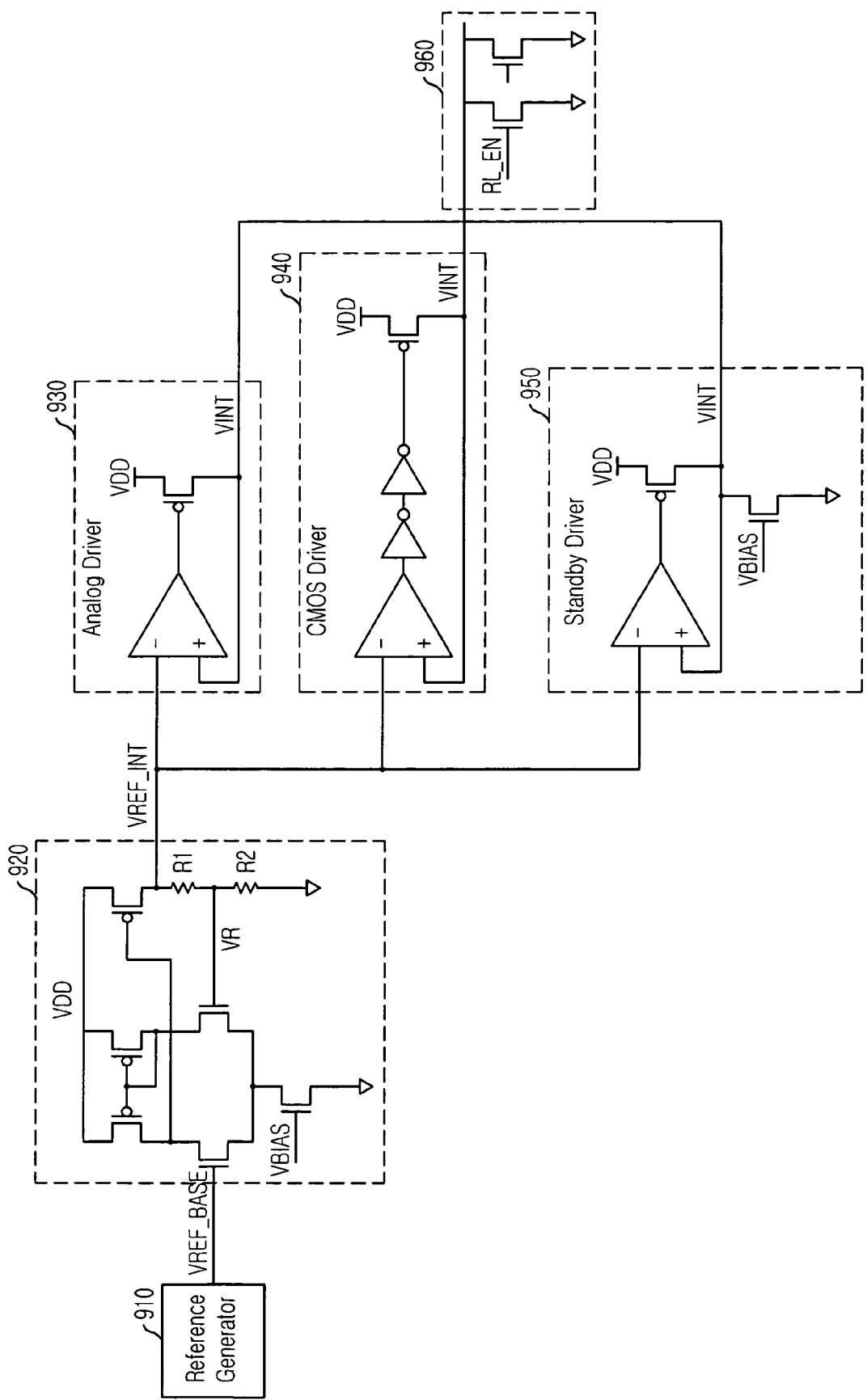
FIG. 9 is a circuit diagram setting forth an internal voltage generator in accordance with a second preferred embodiment of the present invention.

FIG. 9 is a circuit diagram setting forth an internal voltage generator in accordance with a second preferred embodiment of the present invention.

Referring to FIG. 9, the internal voltage generator of the second preferred embodiment includes a reference voltage generator 910, a level shifter 920, an analog driver 930, a CMOS driver 940, a standby driver 950 and a discharging unit 960.

Herein, since the structure and the function of each element employed in the internal voltage generator of the second embodiment are similar to those in the first embodiment except the discharging unit 960, further description except the discharging unit 960 will be abbreviated. Thus, the discharging unit 960 is mainly described in detail hereinafter.

The discharging unit 960 includes two switches for forcibly reducing the voltage level of the internal voltage VINT, while maintaining the pulse width of the release pulse signal RL_EN applied to a gate of the switch constantly.

For instance, if the voltage level of the internal voltage VINT is higher than the first reference voltage VR_1, two switches are turned on. In addition, in case that the voltage level of the internal voltage VINT is between the first reference voltage VR_1 and the second reference voltage VR_2, only one switch is turned on. Likewise, provided that the voltage level of the internal voltage VINT is lower than the second reference voltage VR_2, all the switches are turned off. Like the first preferred embodiment, three or more reference voltages may be utilized for discharging the internal voltage precisely.

Figure 10:
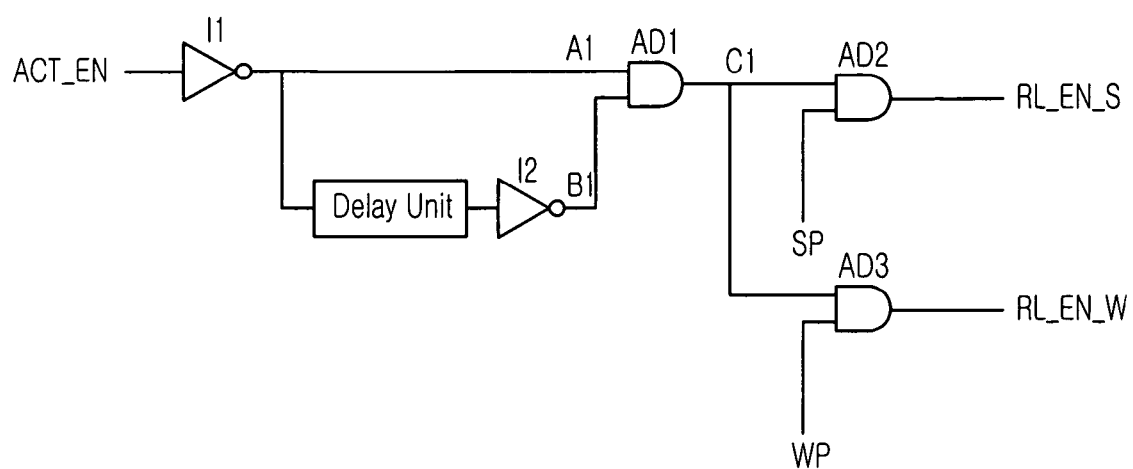
FIG. 10 is a circuit diagram setting forth a release pulse signal generator in accordance with the second preferred embodiment of the present invention.

FIG. 10 is a circuit diagram setting forth a release pulse signal generator in accordance with the second preferred embodiment of the present invention.

Referring to FIG. 10, the release pulse signal generator of the second preferred embodiment includes a plurality of AND gates, a plurality of inverters and a delay unit. Herein, the release pulse signal generator applies a wide release pulse signal RL_EN_W to two switches so that two switches are turned on if the voltage level of the internal voltage VINT is higher than the first reference voltage VR_1. If the voltage level of the internal voltage VINT is between the first reference voltage VR_1 and the second reference voltage VR_2, a short pulse signal RL_EN_S is applied to one switch so that only one switch is turned on.

Figure 11:
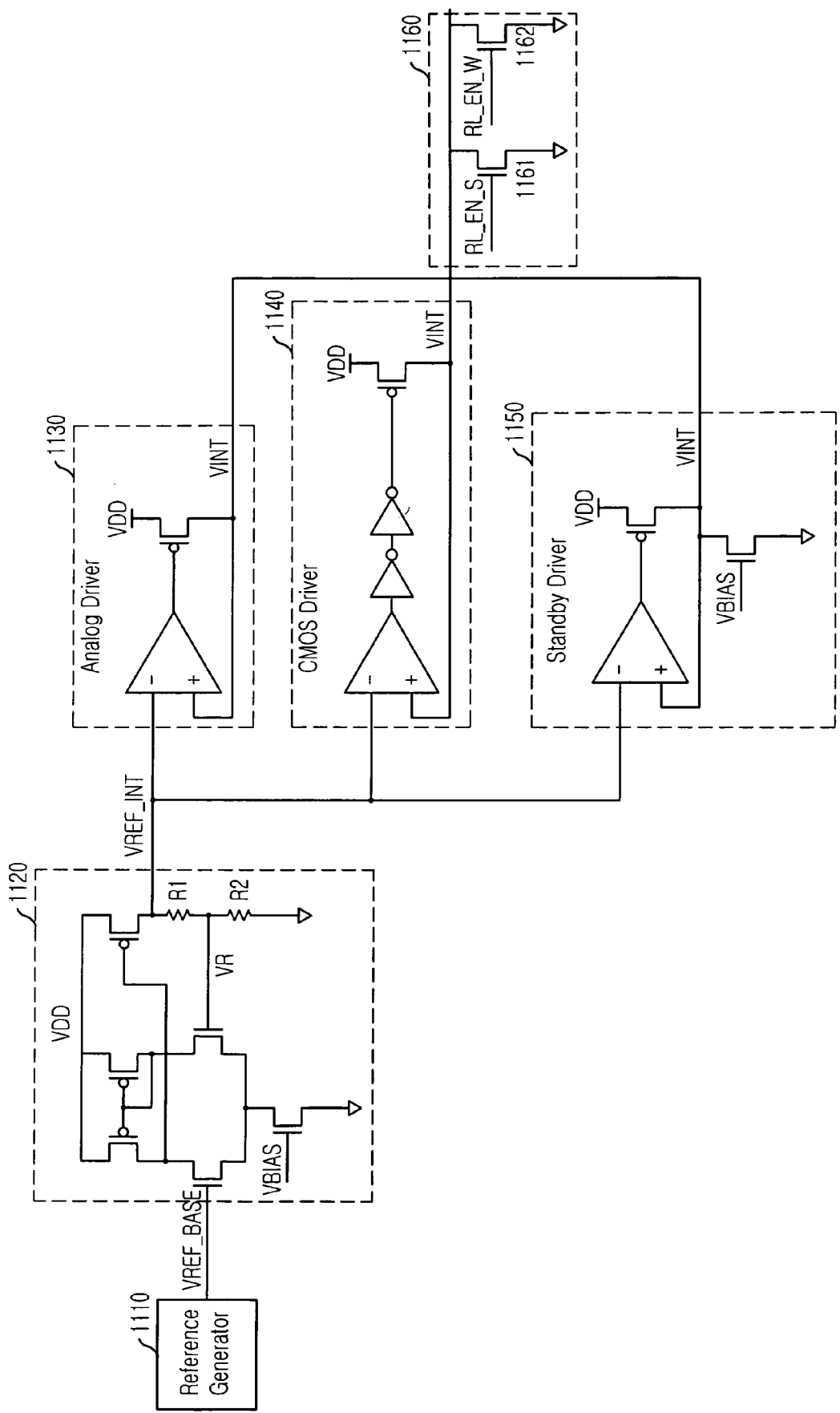
FIG. 11 is a block diagram setting forth an internal voltage generator in accordance with a third preferred embodiment of the present invention.

FIG. 11 is a block diagram setting forth an internal voltage generator in accordance with a third preferred embodiment of the present invention.

Referring to FIG. 11, the internal voltage generator of the third preferred embodiment includes a reference voltage generator 1110, a level shifter 1120, an analog driver 1130, a CMOS driver 1140, a standby driver 1150 and a discharging unit 1160.

Herein, the structure and the function of each element employed in the internal voltage generator of the third embodiment are also similar to those in the first and the second embodiments, except the discharging unit 1160. Thus, the discharging unit 1160 is mainly described in detail hereinafter.

The discharging unit 1160 selectively applies the control signal of the release pulse signal RL_EN to a first switch 1161 or a second switch 1162. In the third preferred embodiment, the width of the release pulse signal applied to the respective switch 1161 and 1162 is not variable. To turn on the respective switch 1161 and 1162 can be achieved by size difference therebetween. That is, the size of the first switch 1161 is set to be different from the second switch 1162.

For example, in case of implementing the first switch 1161 having a smaller size than the second switch 1162, current flowing through the first switch 1161 is less than current flowing through the second switch 1162. Therefore, if the voltage level of the internal voltage VINT is higher than the first reference voltage VR_1, the second switch 1162 is turned on. Additionally, provided that the voltage level of the internal voltage VINT is between the first reference voltage VR_1 and the second reference voltage VR_2, the first switch 1161 is turned on. It is noted that the release pulse signal generator of the second embodiment can be also applied to the internal voltage generator of the third preferred embodiment.

As aforementioned, the present invention provides an enhanced internal voltage generator which discharges the over-supplied voltage X of the internal voltage VINT instantly so as to maintain the voltage level of the internal voltage VINT precisely. In addition, the discharging operation for forcibly discharging the over-supplied voltage X is not performed during an active mode so that there is no dangerous factor to deteriorate the active driver.

The present application contains subject matter related to the Korean patent application No. KR 2004-87320, filled in the Korean Patent Office on Oct. 29, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. An internal voltage generator, comprising:
   a reference voltage generation means for outputting at least one reference voltage with a predetermined voltage level after receiving an external voltage;
   a level shifting means for outputting an internal reference voltage with a shifted voltage level by receiving the reference voltage of the reference voltage generation means;
   a driving means for outputting an internal voltage by using the internal reference voltage; and
   a discharging means to allow discharging an over-supplied voltage of the internal voltage under the control of a release pulse signal whose pulse width is varied according to a voltage level of the over-supplied voltage.

2. The internal voltage generator as recited in claim 1, further comprising a release pulse signal generation means for generating the release pulse signal to control the discharging means.

3. The internal voltage generator as recited in claim 1, wherein the driving means includes:
   an active driver for outputting an active internal voltage during an active mode by using the internal reference voltage; and
   a standby driver for outputting an standby internal voltage regardless of operation state by using the internal reference voltage.

4. The internal voltage generator as recited in claim 2, wherein the release pulse signal generation means includes:
   a pulse enable signal generator for generating a first and a second pulse enable signals using a first reference voltage and a second reference voltage;
   a flag signal generator for generating a wide pulse signal or a short pulse signal using the first and the second pulse enable signals; and
   a release pulse signal generator for generating the release pulse signal using the wide pulse signal and the short pulse signal.

5. The internal voltage generator as recited in claim 4, wherein the pulse enable signal generator includes:
   a first comparator for comparing the internal voltage with the first reference voltage;
   a first transfer gate for transferring the output signal of the first comparator, which is controlled by an active enable pulse signal;
   a second comparator for comparing the internal voltage with the second reference voltage; and
   a second transfer gate for transferring the output signal of the second comparator, which is controlled by the active enable pulse signal.

6. The internal voltage generator as recited in claim 5, wherein the pulse enable signal generator further includes:
   a first latching/delaying unit for latching and delaying the transferred signal from the first transfer gate, thereby outputting the first pulse enable signal; and
   a second latching/delaying unit for latching and delaying the transferred signal from the second transfer gate, thereby outputting the second pulse enable signal.

7. The internal voltage generator as recited in claim 4, wherein the flag signal generator outputs the wide pulse signal if the internal voltage is higher than the first reference voltage, and outputs the short pulse signal if the internal voltage is between the first reference voltage and the second reference voltage.

8. The internal voltage generator as recited in claim 7, wherein the flag signal generator includes:
   a first AND gate for performing a logic AND operation to the first and the second pulse enable signals so as to output the wide pulse signal; and
   a second AND gate for performing a logic AND operation to an inverted first pulse enable signal and the second pulse enable signal so as to output the short pulse signal.

9. The internal voltage generator as recited in claim 4, wherein the release pulse signal generator includes:
   a first inverter for inverting the active enable pulse signal;
   a first delay for delaying the output signal of the first inverter by a first predetermine time;
   a second inverter for inverting the output signal of the first delay;
   a third AND gate for performing a logic AND operation to the output signal of the first inverter and the output signal of the second inverter;
   a fourth AND gate for performing a logic AND operation to the output signal of the third AND gate and the short pulse signal;
   a second delay for delaying the output signal of the first inverter by a second predetermined time;
   a third inverter for inverting the output signal of the second delay;
   a fifth AND gate for performing a logic AND operation to the output of the first inverter and the output of the third inverter;
   a sixth AND gate for performing a logic AND operation to the wide pulse signal and the output of the fifth AND gate; and
   a NOR gate for performing a logic NOR operation to the output of the fourth AND gate and the output of the sixth AND gate so as to output the release pulse signal.

10. The internal voltage generator as recited in claim 2, wherein the discharging means includes at least one switch.

11. The internal voltage generator as recited in claim 10, wherein the number of switches activated in the discharging means is varied according to the over-supplied voltage of the internal voltage.

12. The internal voltage generator as recited in claim 11, wherein each switch in the discharging means has a same size.

13. The internal voltage generator as recited in claim 12, wherein the release pulse signal generation means includes:

a pulse enable signal generator for generating a first and a second pulse enable signals using a first reference voltage and a second reference voltage;

a flag signal generator for generating a wide pulse or a short pulse signal using the first and the second pulse enable signals; and a release pulse signal generator for generating the release pulse signal using the wide pulse signal and the short pulse signal.

14. The internal voltage generator as recited in claim 10, wherein a first release pulse signal is applied to said each switch in the discharging means in case that the internal voltage is higher than the first reference voltage, and a second release pulse signal is applied to one of said each switch in case that the internal voltage is between the first reference voltage and the second reference voltage.

15. The internal voltage generator as recited in claim 10, wherein one of the at least one switch in the discharging means is selectively turned on according to the over-supplied voltage.

16. The internal voltage generator as recited in claim 15, wherein each switch in the discharging means has a size different from each other.

17. The internal voltage generator as recited in claim 16, wherein the release pulse signal generator includes:

a pulse enable signal generator for generating a first and a second pulse enable signals using a first reference voltage and a second reference voltage;

a flag signal generator for generating a wide pulse or a short pulse signal using the first and the second pulse enable signals; and a release pulse signal generator for generating the release pulse signal using the wide pulse signal and the short pulse signal.

18. The internal voltage generator as recited in claim 17, wherein the release pulse generator includes:

a first inverter for inverting the active enable poise signal;

a first delay for delaying the output signal of the first inverter by a first predetermine time;

a second inverter for inverting the output signal of the first delay;

a first AND gate for performing a logic AND operation to the output signal of the first inverter and the output signal of the second inverter, a second AND gate for performing the output signal of the first AND gate and the short pulse signal; and a third AND gate for performing a logic AND operation to the output of the front AND gate and the wide pulse signal.

19. A method for controlling an internal voltage generator, comprising the steps of:

a) outputting a reference voltage with a predetermined voltage level by receiving an external voltage;

b) outputting an internal reference voltage with a shifted voltage level by receiving the reference voltage;

c) outputting an internal voltage in an active mode by using the internal reference voltage;

d) outputting an standby internal voltage regardless of an operation state by using the internal reference voltage; and e) forcibly discharging the internal voltage by using a release pulse signal outputted from a release pulse signal generator, wherein the release pulse signal is outputted when an active enable pulse signal is deactivated.

20. The method as recited in claim 19, wherein a width of the release pulse signal is varied by an over-supplied voltage of the internal voltage.

21. The method as recited in claim 19, wherein number of switch for discharging the internal voltage forcibly is varied by over-supplied voltage of the internal voltage.

22. The method as recited in claim 21, wherein each switch for discharging the internal voltage forcibly has a same size.

23. The method as recited in claim 19, wherein one of switches is selectively turned on according to the over-supplied voltage by means of the release pulse signal.

24. The method as recited in claim 23, wherein each switch for discharging the internal voltage forcibly has a size different from each other.

* * * * *

UNITED STATES PATENT AND TRADEMARK OFFICE
CERTIFICATE OF CORRECTION

PATENT NO. : 7,250,811 B2
APPLICATION NO. : 11/026994
DATED : July 31, 2007
INVENTOR(S) : Kim It is certified that error appears in the above-identified patent and that said Letters Patent is hereby corrected as shown below:

Col. 10, Line 57 in claim #10, line 1, please delete "2" and insert -- 1 --.

Signed and Sealed this

Eighth Day of April, 2008

JON W. DUDAS
*Director of the United States Patent and Trademark Office*